United States Patent
Klass

(10) Patent No.: US 11,204,384 B1
(45) Date of Patent: Dec. 21, 2021

(54) METHODS AND SYSTEMS FOR SWITCHABLE LOGIC TO RECOVER INTEGRATED CIRCUITS WITH SHORT CIRCUITS

(71) Applicant: Apple Inc., Cupertino, CA (US)

(72) Inventor: Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 342 days.

(21) Appl. No.: 16/138,379

(22) Filed: Sep. 21, 2018

(51) Int. Cl.
  *G01R 31/317* (2006.01)
  *G06F 1/3287* (2019.01)
  *G01R 31/3187* (2006.01)
  *G01R 31/50* (2020.01)

(52) U.S. Cl.
  CPC ... *G01R 31/31721* (2013.01); *G01R 31/3187* (2013.01); *G01R 31/31715* (2013.01); *G01R 31/50* (2020.01); *G06F 1/3287* (2013.01)

(58) Field of Classification Search
  CPC .............. G01R 31/31721; G01R 31/50; G01R 31/31715; G01R 31/3187; G06F 1/3287
  USPC ............................. 324/327, 345, 714, 750.3
  See application file for complete search history.

(56) References Cited

U.S. PATENT DOCUMENTS

| | | | |
|---|---|---|---|
| 7,567,091 B2 | 7/2009 | Farnworth et al. | |
| 7,571,413 B1 * | 8/2009 | Dastidar | G01R 31/318516 326/37 |
| 7,675,308 B1 | 3/2010 | Chen et al. | |
| 7,944,285 B1 | 5/2011 | Thirunavukarasu et al. | |
| 8,055,966 B1 * | 11/2011 | Sogani | G01R 31/318513 714/733 |
| 8,504,967 B2 | 8/2013 | Suzuki et al. | |
| 9,100,001 B2 | 8/2015 | Groot et al. | |
| 9,337,825 B2 | 5/2016 | Takayanagi et al. | |
| 9,671,455 B2 | 6/2017 | Kawasaki | |
| 2008/0301511 A1 * | 12/2008 | Miller | G01R 31/31928 714/733 |
| 2010/0231252 A1 * | 9/2010 | Goel | G01R 31/31723 324/750.3 |
| 2017/0153958 A1 * | 6/2017 | Parikh | G06F 11/24 |

FOREIGN PATENT DOCUMENTS

JP   2012173056   9/2012

* cited by examiner

*Primary Examiner* — Melissa J Koval
*Assistant Examiner* — Courtney G McDonnough
(74) *Attorney, Agent, or Firm* — Kowert, Hood, Munyon, Rankin & Goetzel, P.C.; Erik A. Heter

(57) ABSTRACT

In some embodiments, a system and/or method may test logic blocks for an integrated circuit. To alleviate problems associated with current methods of integrated circuit testing, a system may include a power switch control signal on a different voltage rail. In some embodiments, a Test VDD may be used to isolate the power switches from the rest of the logic cells in an integrated circuit. During testing, each logic block may be powered individually using the Test VDD to control the power switches to the logic blocks. When a logic block short is identified, the nonviable logic block may be isolated to such that the nonviable logic block is not used during the future and only viable logic blocks are used in the integrated circuit. This allows for use of logic within an integrated circuit that might otherwise have been discarded or destroyed because of one or more shorts.

20 Claims, 3 Drawing Sheets

METHODS AND SYSTEMS FOR SWITCHABLE LOGIC TO RECOVER INTEGRATED CIRCUITS WITH SHORT CIRCUITS

BACKGROUND

Technical Field

Embodiments described herein relate to integrated circuits and methods for testing integrated circuits. More particularly, some embodiments disclosed herein relate to testing integrated circuits and recovering certain integrated circuits based upon test results.

Description of the Related Art

Many shorts occur in logic that is controlled by power switches that bridge a virtual VDD and a true VDD in integrated circuits. During currently used methods of testing, a voltage is applied to a power switch in the integrated circuit (IC). If the result is an ohmic curve, the conclusion is nearly always that there is an ohmic short in the logic controlled by the power switch. The tested IC is declared as nonviable and discarded (or "binned").

SUMMARY

In some embodiments, a system and/or method may test individual logic blocks in an integrated circuit. To alleviate problems associated with current methods of integrated circuit testing, a system may include a power switch control circuit on a different voltage rail. In some embodiments, a Test VDD may be used to isolate the control circuit for the power switches from the rest of the logic cells in an integrated circuit. Each logic block may be tested in isolation by opening or closing power switches using the control circuit and the Test VDD, which may be powered to a level that ensures that control signals to the power switches turn the power switches fully on or off. One or more relatively low voltages (e.g. as compared to the Test VDD voltage) may be applied to the VDD input and, if an ohmic response in the current to the logic block under test is detected, a short may be identified for the logic block under test. When a short is identified in a logic block, the switches to the nonviable logic block may be isolated such that the nonviable logic block is not used during the future and only viable logic blocks are used in the integrated circuit. This allows for use of logic within an integrated circuit that might otherwise have been discarded or destroyed because of one or more shorts.

In some embodiments, a method may include testing individual logic blocks for an integrated circuit. The method may include ensuring a first set of one or more power switches associated with a first logic block are closed using a control circuit in the integrated circuit. The control circuit may be coupled to a first power supply. The method may include applying a first level of power to the integrated circuit using a second power supply. The method may include measuring a first current consumed by the integrated circuit during application of the first level of power. The method may include determining a viability of the first logic block responsive to the first current. The method may include determining a viability of the integrated circuit. Upon determining that the first logic block is nonviable the integrated circuit is determined to be viable if a second logic block is determined to be viable and the second logic block is redundant relative to the first logic block.

The first logic block and the second logic may be redundant when the first logic block and the second logic block have a same set of inputs and outputs and given the same stimulus on the inputs produce the same results on the outputs.

Upon determining that the first logic block is nonviable the integrated circuit may be determined to be nonviable if there are no viable logic blocks which are redundant to the first logic block.

The method may include powering the control circuit using the first power supply. The second power supply may be different from the first power supply.

The method may include applying a second level of power to the integrated circuit using the second power supply. The second level of power may be different from the first level of power. The method may further include measuring a second current consumed by the integrated circuit during application of the second level of power. The method may include determining a viability of the first logic block responsive to the second current.

The method may include opening the first set of one or more power switches of the integrated circuit and closing a second set of one or more power switches associated with the second logic block using the control circuit. Further the method may include applying a third level of power to the integrated circuit using the second power supply and measuring a third current consumed by the integrated circuit during application of the third level of power. The method may include determining a viability of the second logic block responsive to the third current.

The method may include applying a fourth level of power to the integrated circuit using the second power supply. The fourth level of power may be different from the third level of power. The method may include measuring a fourth current consumed by the integrated circuit during application of the fourth level of power and determining a viability of the second logic block responsive to the fourth current.

In some embodiments, in response to a determination that the integrated circuit is viable, power switches of any nonviable logic blocks are deactivated such that a short is inhibited from occurring during normal use of the integrated circuit.

In some embodiments, an integrated circuit may include a first logic block and a first power switch associated with the first logic block. The integrated circuit may include a control circuit coupled to the first power switch. The control circuit may be coupled to a first power supply. The control circuit may be configured to control the first power switch to determine a viability of the first logic block. The integrated circuit may include a disabling mechanism which disables the first logic block in accordance with a determination that the first logic block is nonviable.

The control circuit may determine if the integrated circuit is viable based upon a determined viability of the first logic block. Upon determining that the first logic block is nonviable the integrated circuit is determined to be nonviable if there are no viable logic blocks which are redundant to the first logic block.

In some embodiments, a system may be coupled to the integrated circuit. The system may be configured to apply one or more currents to the integrated circuit and measure a consumed current and a viability of the first logic block is determined, by the system, responsive to a measured first current consumed by the integrated circuit during application of the first level of power. A viability of the integrated circuit may determined, and upon determining that the first logic block is nonviable the integrated circuit is determined to be viable if a second logic block is determined to be viable and the second logic block is redundant relative to the first logic block.

The first logic block and the second logic may be redundant when the first logic block and the second logic block have a same set of inputs and outputs and given the same stimulus on the inputs produce the same results on the outputs. The first power supply may power the control circuit.

In some embodiments, an integrated circuit may include a second power supply configured to apply a first level of power to the integrated circuit. The second power supply may be different from the first power supply.

In some embodiments, a second level of power is applied to the integrated circuit using the second power supply. The second level of power may be different from the first level of power. A viability of the first logic block is determined responsive to a measured second current consumed by the integrated circuit during application of the second level of power.

In some embodiments, the control circuit opens, during use, the plurality of power switches of the integrated circuit except for a second set of one or more power switches associated with a second logic block. The second power supply may apply, during use, a second level of power to the integrated circuit. A viability of the second logic block may be determined responsive to a measured second current consumed by the integrated circuit during application of the second level of power.

In some embodiments, the portions of power are less than the maximum power allowed according to the limits of the integrated circuit.

In some embodiments, when the integrated circuit is determined to be viable power switches of any nonviable logic blocks are deactivated such that a short is inhibited from occurring during normal use of the integrated circuit.

BRIEF DESCRIPTION OF THE DRAWINGS

The following detailed description makes reference to the accompanying drawings, which are now briefly described.

Figure 1:
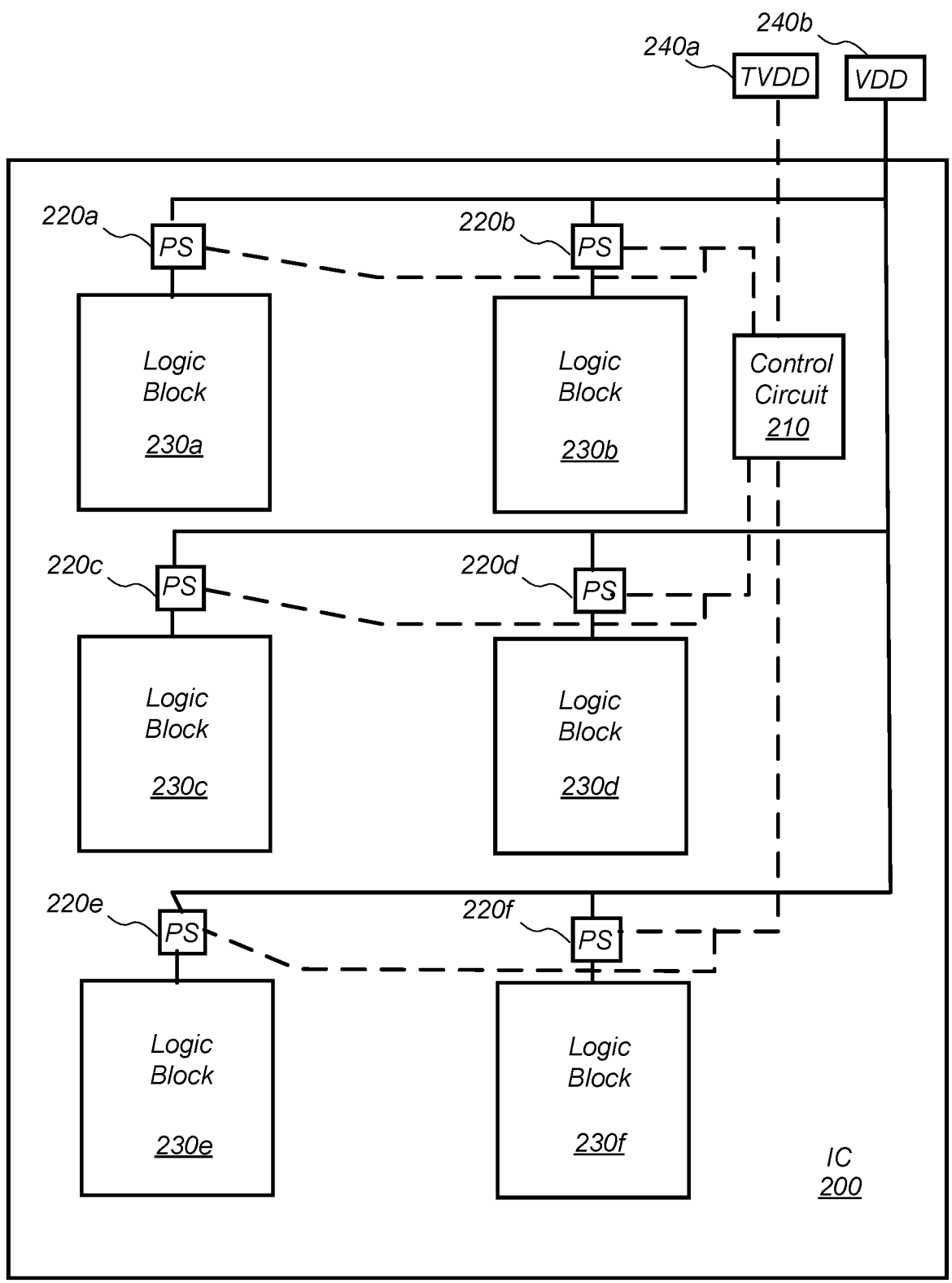
FIG. 1 is a block diagram illustrating an embodiment of an integrated circuit including a control circuit.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112 paragraph (f), interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

Definitions

Unless defined otherwise, all technical and scientific terms used herein have the same meaning as commonly understood by one of ordinary skill in the art.

The term "connected" as used herein generally refers to pieces which may be joined or linked together.

The term "coupled" as used herein generally refers to pieces which may be used operatively with each other, or joined or linked together, with or without one or more intervening members.

The term "directly" as used herein generally refers to one structure in physical contact with another structure, or, when used in reference to a procedure, means that one process effects another process or structure without the involvement of an intermediate step or component.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Embodiments

In some embodiments, a system and/or method may test individual logic blocks for an integrated circuit, where each logic block is separately controlled by one or more power switches. To alleviate problems associated with current methods of integrated circuit testing, a system may include a power switch control circuit on a different voltage rail. For example, a Test VDD may be coupled to the control circuit, and used to isolate the control circuit from the rest of the logic cells in an integrated circuit. During testing, each group of switches for each logic block may be brought up (i.e. powered) individually by controlling the corresponding power switches using the Test VDD. When a short is identified in a logic block, the nonviable logic block may be isolated such that the nonviable logic block is not used and only viable logic blocks are used in the integrated circuit.

In some embodiments, the integrated circuit may include a disabling mechanism which disables a logic block if it is determined that the logic block is nonviable. For example, the power switches may have a fuse input which may be coupled to a fuse in the IC. If a short is detected in a logic block, the fuse may be "blown" and the blown state may disable the power switches so that the shorted logic block is not powered up. This allows for use of an integrated circuit that might otherwise have been discarded or destroyed because of one or more shorts.

Figure 2:
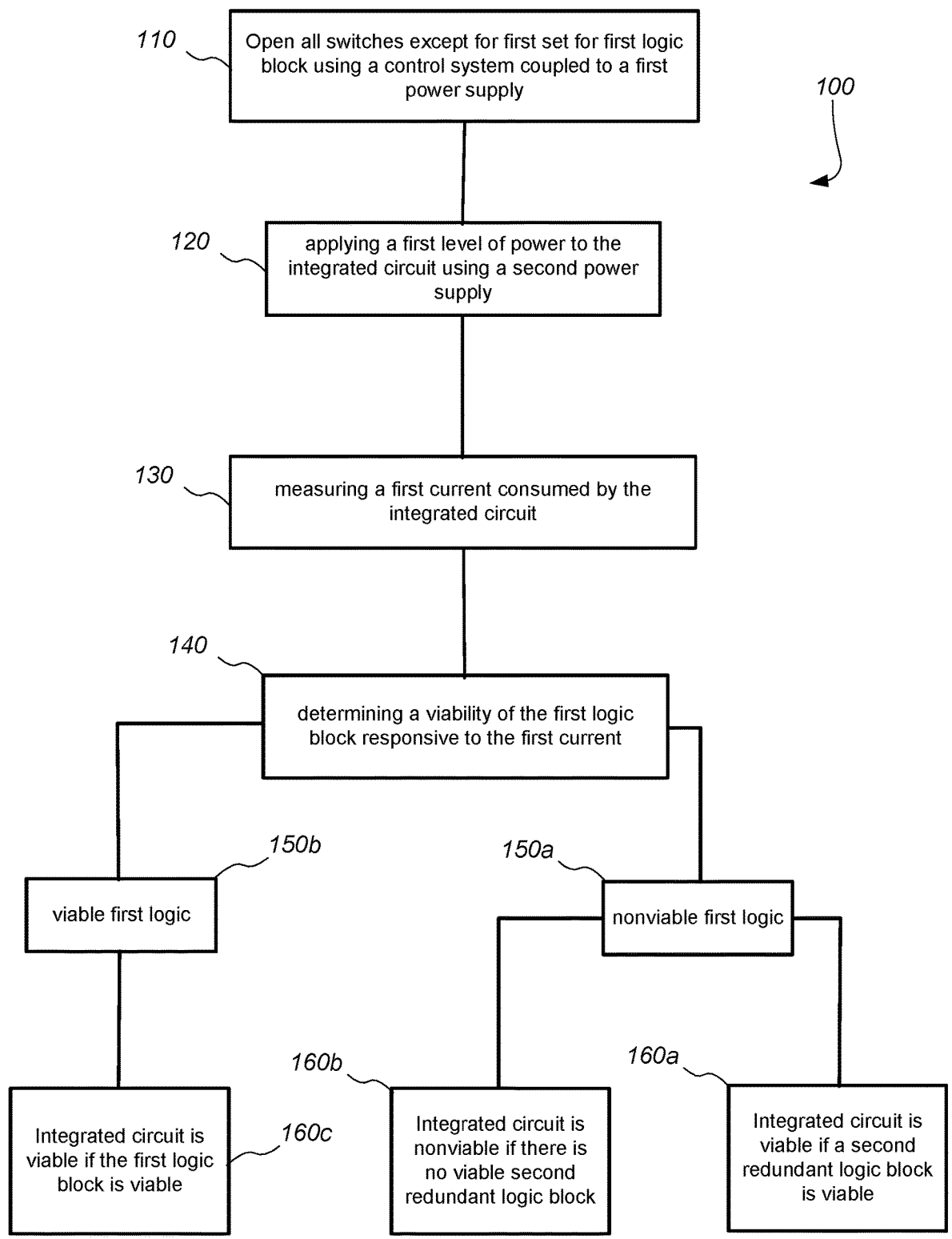
FIG. 2 is a flow chart illustrating an embodiment of a method of testing logic power switches for integrated circuits.

FIG. 1 is a block diagram illustrating an embodiment of an integrated circuit 200 including a control circuit 210 for controlling power switches 220a-f. FIG. 2 depicts a flow chart illustrating an embodiment of a method 100 of testing logic power switches for integrated circuits. In some embodiments, a method may include testing individual logic blocks 230a-f for integrated circuit 200. The integrated circuit may be tested using a system coupled (e.g., electrically) to the integrated circuit. The individual logic blocks on an integrated circuit may be tested, for example, sequentially.

A logic block, as used herein, may refer to any combination of logic circuitry, state machines, state elements such as flip flops, registers, and the like, memory, etc. that implements a defined set of functionality within the IC 200 and has an interface to other logic blocks in the IC 200. Thus, a logic block may be a specific predefined component such as a processor, a cache, a peripheral component, a peripheral interface unit, a memory controller, etc.

The logic block may be independently powered up and down during use, as desired for power control and/or based on use of the logic block during operation. The power switches 220a-f may provide the independent power functionality, since the power switches may be controlled to connect the power input to the corresponding logic block 230a-230f (virtual VDD) to the true VDD input to the IC (e.g. via the VDD input 240b). That is, if the power switches 220a-f to a given logic block 230a-f are closed (or enabled), the given logic block 230a-f may be powered on as the virtual VDD is powered to the true VDD. If the power switches to the given logic block 230a-f are open (e.g. disabled), then the given logic block 230a-f is powered off as the virtual VDD is not powered.

A first logic block 230a-f may be redundant if the first logic block implements the same set of functionality as a second logic block 230a-f. For example, if the first logic block 230a-f implements a processor and the second logic block 230a-f also implements a processor in a multi-processor system, the processors may be viewed as redundant to each other. That is the first logic block and the second logic block have a same set of inputs and outputs and, given the same stimulus on the inputs, produce the same results on the outputs. The IC 200 may still function properly if one of the processors is not operable. Accordingly, a given instance of the IC 200 may still be usable in a product if one of the redundant logic blocks is not viable but the IC 200 still provides acceptable performance for the product without the nonviable redundant logic block. Alternatively, the IC 200 may be intentionally designed with redundant logic blocks, so that the IC 200 provides sufficient performance even if one or more of the redundant logic blocks is non-functional. In still another example, the IC 200 with one or more non-viable logic blocks may be used in one product that requires less performance from the IC 200, but may be used in another product that requires more performance from the IC 200 if all the redundant logic blocks are viable.

The power switches 220a-f may be any circuitry that may respond to an enable/disable control signal to connect/disconnect the virtual VDD to/from the true VDD. For example, each power switch 220a-f may include one or more PMOS transistors having their source/drain paths connected to the virtual VDD of the corresponding logic blocks 230a-f and the true VDD input 240b. The gate terminals of the power switches 220a-f may be coupled to the enable/disable control signal. The gate terminals may also be coupled to the control circuit 210 for testing. In other embodiments, the power switches 220a-f may couple a virtual VSS (or ground) grid for the logic blocks 230a-f to a true VSS (or ground) for the IC 200.

The true VDD input 240a may generally correspond to one or more pins on the IC 200 to which the VDD power supply may be coupled, during use. Typically, multiple pins arranged physically across the surface of the package for the IC 200 may be used to handle the electrical current requirements for the VDD inputs.

Before testing the viability of the integrated circuit all power switches may be open (110) (such that electricity is not allowed through the switch) of the integrated circuit. Initially the switches may be in any state and may be adjusted as need be. For example the switches may be in a varied state and the switches may all be opened. The method may include ensuring a first set of power switches 220a associated with a first logic block 230a are closed using the control circuit 210. The control circuit may be coupled directly to the power switches 220a-f. The control circuit 210 may be coupled to a first power supply 240a (e.g., a "test" power supply or test VDD (TVDD)). The method may include powering the control circuit using the first power supply. Thus the control circuit 210 may be known to be operating correctly even though the true VDD is not powered fully, and thus the state of the control inputs to the power switches 220*a-f* is known to be enabled or disabled as set by the control circuit 210.

VDD is a label referring to the power supply of an integrated circuit (IC). Another one of the supply rails will be referred to as ground (abbreviated "GND")—positive and negative voltages are relative to the ground. Thus, the magnitude of the voltage VDD is a measure of its energy relative to the ground. In digital electronics, negative voltages are seldom present, and the ground nearly always is the most negative voltage level. In analog electronics (e.g., an audio power amplifier) the ground can be a voltage level between the most positive and most negative voltage level. Complimentary Metal-Oxide-Semiconductor (CMOS) ICs have generally borrowed the N-type MOS (NMOS) convention of $V_{DD}$ for positive and $V_{SS}$ for negative (ground) even though both positive and negative supply rails connect to source terminals (the positive supply goes to P-type MOS (PMOA) sources, the negative supply to NMOS sources).

The method may include applying (120) a first level of power to the integrated circuit using a second power supply 240*b* (the "true" power supply, or simply VDD). The second power supply is different from the first power supply. The method may include measuring (130) a first current consumed by the integrated circuit during application of the first level of power.

The voltage level on the true VDD may be a relatively low level (e.g. on the order of 50-100 mili-Volts (mV). The low level may not be sufficient to fully power the logic blocks 230*a-f* and the virtual VDD grid that supplies the logic blocks 230*a-f*. Thus, if a short exists, the current flowing through the short may be low and the integrated circuit 200 may not be damaged by the current flow. Multiple voltage levels in the low range may be tested, in some embodiments.

In some embodiments, the method may include determining (140) a viability of the first logic block responsive to the first current. The method may include determining a viability of the integrated circuit. In some embodiments, in response to determining that the first logic block is nonviable (150*a*) the integrated circuit is determined (160*a*) to be viable if a second logic block is determined to be viable and the second logic block is redundant relative to the first logic block. In some embodiments, upon determining (150*a*) that the first logic block is nonviable the integrated circuit is determined (160*b*) to be nonviable if there are no other logic blocks determined to be viable which are functionally redundant relative to the first logic block. In some embodiments, when the integrated circuit is determined to be viable, power switches of any nonviable logic blocks are deactivated such that a short is inhibited from occurring during normal use of the integrated circuit. For example, fuses may be used to ensure that the power switches to the nonviable blocks remain disabled.

In some embodiments, in response to determining (150*b*) that the first logic block is viable, the integrated circuit is determined (160*c*) to be viable (dependent upon the determined status of the remaining logic blocks) by a test device that is executing the test.

It should be noted that the above embodiment is exemplary in that the method and system are described as having been applied to only a couple of logic blocks on an integrated circuit. The method may be applied to some, a majority, or all of the logic blocks on an integrated circuit. Typically the method would be applied to all of the logic blocks on an integrated circuit in order to determine if the integrated circuit as a whole is viable.

For example, in some embodiments, the method may include opening all power switches of the integrated circuit 200 except for a second set of power switches 220*b* associated with the second logic block 230*b* using the control circuit 210. A third level of power is applied to the integrated circuit using the second power supply 240*b*. Consumption of a third current by the integrated circuit during application of the third level of power is measured. A viability of the second logic block responsive to the third current is determined. The method may include determining a viability of the integrated circuit. In some embodiments, upon determining that the second logic block is nonviable the integrated circuit is determined to be viable if the first, or a third, logic block is determined to be viable and the first, or the third, logic block is redundant relative to the second logic block. In some embodiments, upon determining that the second logic block is nonviable the integrated circuit is determined to be nonviable if there are no other logic blocks determined to be viable which are functionally redundant relative to the second logic block.

In some embodiments, the method may include applying a second level of power to the integrated circuit using the second power supply. The second level of power is different from the first level of power. Consumption of a second current by the integrated circuit during application of the second level of power is measured. Different levels of power or steps may be applied to determine if the current changes between those steps. If the current changes in an ohmic fashion then it is an indication that there exists a short. The measured consumptions of the first level of power and the second level of power may be compared in order to determine if the first logic block is viable. For example, a couple of steps of increase in the tested power levels to see if current changes between those steps may indicate one has a short because the transistor is conducting a little bit or leaking.

In some embodiments, the method may include applying a fourth level of power to the integrated circuit using the second power supply. The fourth level of power is different from the third level of power. Consumption of a fourth current by the integrated circuit during application of the fourth level of power is measured. The measured consumptions of the third level of power and the fourth level of power may be compared in order to determine if the second logic block is viable. It should be noted herein first through fourth levels of power are discussed as examples only and any number points or levels of power may be applied and the corresponding currents can be plotted or otherwise analyzed. The analyzed points may be used to determine if there is an ohmic curve or an exponential curve. An ohmic curve might be indicative of a short and an exponential curve or other nonlinear curve might be indicative of leakage current. More data points may allow for more accurate differentiation between nonviable blocks and ordinary leakage current which varies by the processes for which the blocks are configured.

In some embodiments, the levels of power applied to VDD during the test are less than the maximum power allowed according to the limits of the integrated circuit and/or less than the power level specified for functional operation of the integrated circuit in order to reduce the chances of destroying the integrated circuit being tested due to over-current conditions.

In some embodiments, when the integrated circuit is determined to be viable power switches of any nonviable logic blocks are deactivated such that a short is inhibited from occurring during normal use of the integrated circuit. A disabling mechanism may be used to disable, during use, a logic block if the logic block is determined to be nonviable. The logic block may be disabled at power up of the integrated circuit if the logic block is determined to be nonviable (e.g., have shorts). For example a fuse may be used to incapacitate a nonviable logic block.

After the integrated circuit has been tested the test power supply may be tied to the true power supply so that this logic is on (that is, the TVDD and VDD inputs 240a-b may be connected together). The external input may be tied so that the test input will allow the integrated circuit to be on or activated.

Figure 3:
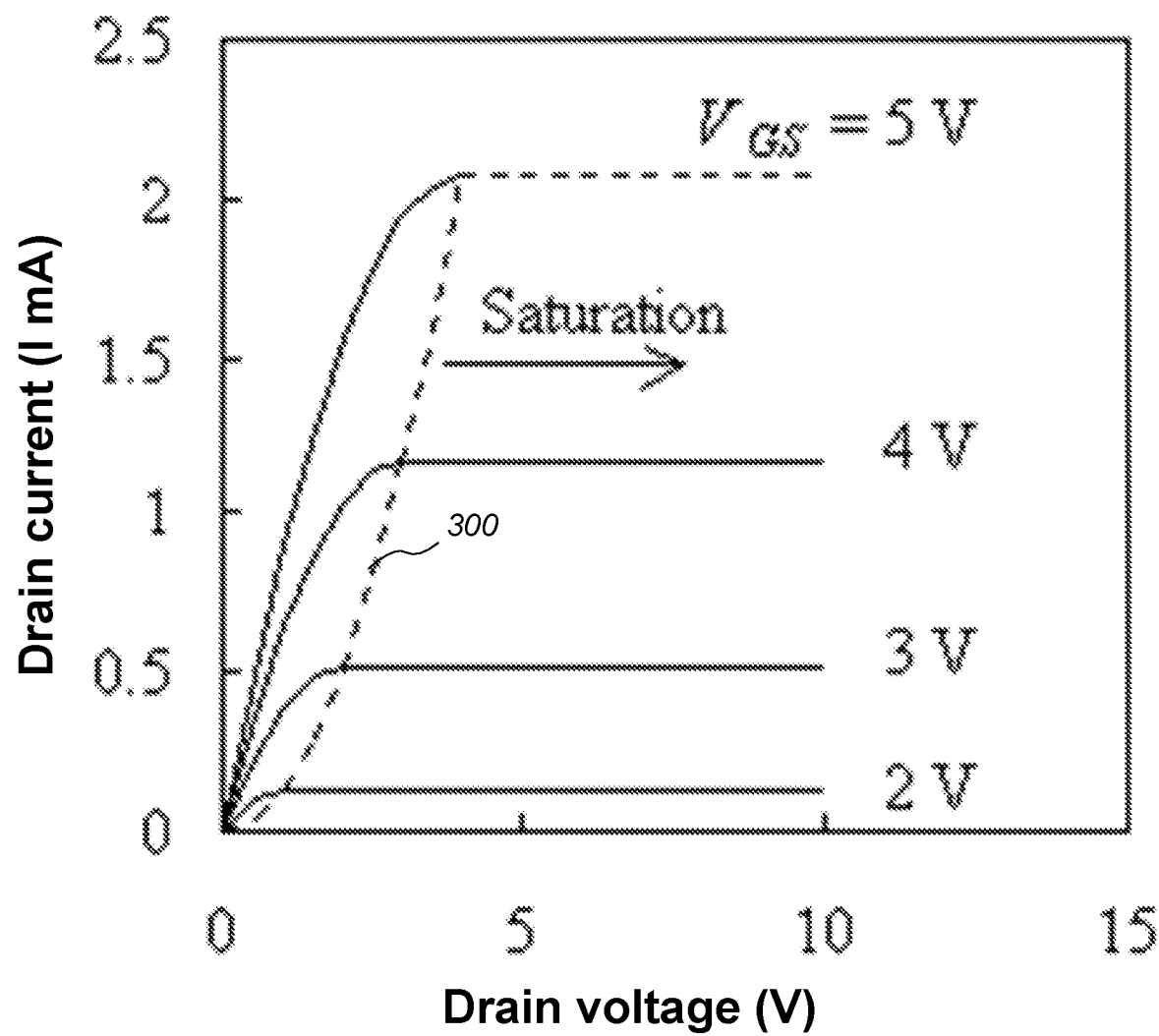
FIG. 3 is an embodiment of exemplary graph of current-voltage characteristics of an n-type MOSFET as obtained with the quadratic model. The dotted line separates the quadratic region of operation on the left from the saturation region on the right.

FIG. 3 is an embodiment of exemplary graph of current-voltage characteristics of an n-type MOSFET as obtained with the quadratic model. The dotted line 300 separates the quadratic region of operation on the left from the saturation region on the right. Typically there is the threshold voltage where it is fully on (i.e., the saturation) and a ramping up to the threshold voltage as shown in FIG. 3.

Power from the second power supply may be kept at a relatively low level. The purpose of keeping the testing levels low is to ensure that the integrated circuit is not damaged due to the appearance of a short during testing. If ohmic resistance is detected then this could be evidence of a short. If a measured current is more than the leakage current would normally be this is typically evidence of a short.

Based on the foregoing, various embodiments of this disclosure may include an integrated circuit may include a logic block (e.g., a first logic block), a power switch (e.g., a first power switch), and a control circuit. The power switch may be associated with the logic block. The control circuit may be coupled (e.g., directly) to the integrated circuit. The control circuit may be coupled to a first power supply. The control circuit may control, during use, the power switch to determine a viability of the logic block.

In some embodiments, the integrated circuit may include a disabling mechanism. The disabling mechanism may disable, during use, the logic block if determined to be nonviable.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. A method of testing individual logic blocks for an integrated circuit, comprising:
ensuring a first set of one or more power switches associated with a first logic block are closed using a control circuit in the integrated circuit, wherein the control circuit is coupled to a first power supply and a second power supply, wherein the first logic block is one of a plurality of logic blocks implemented on the integrated circuit, wherein ones of the plurality of logic blocks are configured to be independently powered up and powered down by correspondingly coupled ones of a plurality of power switches;
applying a first level of power to the integrated circuit using the second power supply;
measuring a first current consumed by the integrated circuit during application of the first level of power;
determining a viability of the first logic block responsive to the first current, wherein determining a viability of the first logic block comprises determining whether a short circuit exists in the first set of one or more power switches; and
determining a viability of the integrated circuit, wherein upon determining that the first logic block is nonviable the integrated circuit is determined to be viable if a second logic block is determined to be viable and the second logic block is redundant relative to the first logic block.

2. The method of claim 1, wherein the first logic block and the second logic are redundant, wherein the first logic block and the second logic block have a same set of inputs and a same set of outputs, and given a same stimulus on their respective inputs, produce same results on their respective outputs.

3. The method of claim 1, wherein upon determining that the first logic block is nonviable the integrated circuit is determined to be nonviable if there are no viable logic blocks which are redundant to the first logic block.

4. The method of claim 1, further comprising powering the control circuit using the first power supply.

5. The method of claim 1, further comprising the second power supply providing the first level at a level that is less than a maximum specified power limit of the integrated circuit.

6. The method of claim 1, further comprising:
applying a second level of power to the integrated circuit using the second power supply, wherein the second level of power is different from the first level of power;
measuring a second current consumed by the integrated circuit during application of the second level of power; and
determining a viability of the first logic block responsive to the second current.

7. The method of claim 1, further comprising:
opening the first set of one or more power switches of the integrated circuit and closing a second set of one or more power switches associated with the second logic block using the control circuit;
applying a third level of power to the integrated circuit using the second power supply;
measuring a third current consumed by the integrated circuit during application of the third level of power; and
determining a viability of the second logic block responsive to the third current.

8. The method of claim 7, further comprising: applying a fourth level of power to the integrated circuit using the second power supply, wherein the fourth level of power is different from the third level of power; measuring a fourth current consumed by the integrated circuit during application of the fourth level of power; and determining a viability of the second logic block responsive to the fourth current.

9. The method of claim 1, wherein in response to a determination that the integrated circuit is viable, power switches of any nonviable logic blocks are deactivated such that a short is inhibited from occurring during normal use of the integrated circuit.

10. The method of claim 1, further comprising the second power supply providing the first level at a level that is less than a power level specified for functional operation of the integrated circuit.

11. An integrated circuit, comprising:
- a plurality of logic blocks implemented on the integrated circuit, the plurality of logic blocks including a first logic block;
- a plurality of power switches associated with ones of the plurality of logic blocks including a first power switch associated with the first logic block, wherein ones of the plurality of power switches are configured such that ones of the plurality of logic blocks are separately and independently controllable from one another;
- a control circuit coupled to the first power switch, wherein the control circuit is coupled to a first power supply and a second power supply, and wherein the control circuit is configured to control the first power switch to determine a viability of the first logic block, wherein the second power supply is configured to apply a first level of power to the integrated circuit, wherein the second power supply is different from the first power supply, and wherein the first power switch is configured to couple one of the first or second power supplies to provide power to the first logic block at a given time; and
- a disabling mechanism configured to disable the first logic block in accordance with a determination that the first logic block is nonviable in response to detecting a short circuit in the first power switch, wherein power switches corresponding to nonviable logic blocks are configured to be deactivated such that a short is inhibited from occurring during normal use of the integrated circuit.

12. The integrated circuit of claim 11, wherein the control circuit is configured to determine if the integrated circuit is viable based upon a determined viability of the first logic block.

13. The integrated circuit of claim 11, wherein in response to determining that the first logic block is nonviable, the control circuit is configured to determine that the integrated circuit is nonviable if there are no viable logic blocks which are redundant to the first logic block.

14. The integrated circuit of claim 11, wherein a system coupled to the integrated circuit during test is configured to cause one or more levels of power to be applied to the integrated circuit and further configured to measure a consumed current, wherein a viability of the first logic block is determined, by the system, responsive to a measured first current consumed by the integrated circuit during application of a first level of power.

15. The integrated circuit of claim 14, wherein the first logic block and the second logic are redundant, wherein the first logic block and the second logic block have a same set of inputs and a same set of outputs and, given a same stimulus on their respective inputs, produce same results on their respective outputs.

16. The integrated circuit of claim 11, wherein the first power supply is configured to provide power to the control circuit.

17. The integrated circuit of claim 11, further comprising:
- wherein a second level of power is applied to the integrated circuit using the second power supply, wherein the second level of power is different from the first level of power; and
- wherein a viability of the first logic block is determined responsive to a measured second current consumed by the integrated circuit during application of the second level of power.

18. The integrated circuit of claim 11, further comprising:
- wherein the control circuit opens, during use, the plurality of power switches of the integrated circuit except for a second set of one or more power switches associated with a second logic block;
- wherein the second power supply applies, during use, a second level of power to the integrated circuit; and
- wherein a viability of the second logic block is determined responsive to a measured second current consumed by the integrated circuit during application of the second level of power.

19. The integrated circuit of claim 11, wherein the first and second levels of power are less than maximum specified power limit of the integrated circuit.

20. A system, comprising:
- a plurality of logic blocks implemented on an integrated circuit, the plurality of logic blocks including a first logic block;
- a plurality of power switches associated with ones of the plurality of logic blocks including a first power switch associated with the first logic block, wherein ones of the plurality of power switches are configured such that ones of the plurality of logic blocks are separately and independently controllable from one another;
- a control circuit coupled to the first power switch, wherein the control circuit is coupled to a first power supply and a second power supply, and wherein the control circuit is configured to control the first power switch to determine a viability of the first logic block; and
- a disabling mechanism configured to disable the first logic block in accordance with a determination that the first logic block is nonviable in response to detecting a short circuit in the first power switch,
- wherein a system coupled to the integrated circuit during test is configured to cause one or more levels of power to be applied to the integrated circuit and further configured to measure a consumed current, wherein a viability of the first logic block is determined, by the system, responsive to a measured first current consumed by the integrated circuit during application of a first level of power.

* * * * *